(12) United States Patent  (10) Patent No.: US 9,443,741 B1
Su et al.  (45) Date of Patent: Sep. 13, 2016

(54) ETCHING METHOD FOR REDUCING MICROLOADING EFFECT

(71) Applicant: UNITED MICROELECTRONICS CORP., Hsin-Chu (TW)

(72) Inventors: Po-Wen Su, Kaohsiung (TW); Zhi-Jian Wang, Tainan (TW); Cheng-Chang Wu, New Taipei (TW); Hsin-Yu Hsieh, Tainan (TW); Shui-Yen Lu, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 14/748,257

(22) Filed: Jun. 24, 2015

(30) Foreign Application Priority Data

Jun. 2, 2015 (CN) .......................... 2015 1 0294310

(51) Int. Cl.
 *H01L 21/302* (2006.01)
 *H01L 21/461* (2006.01)
 *H01L 21/308* (2006.01)

(52) U.S. Cl.
 CPC ....... *H01L 21/3085* (2013.01); *H01L 21/3081* (2013.01)

(58) Field of Classification Search
 None
 See application file for complete search history.

(56) References Cited

U.S. PATENT DOCUMENTS

| 6,417,086 | B1* | 7/2002 | Osari | H01L 21/32139 257/E21.232 |
| 7,465,673 | B2 | 12/2008 | Igarashi | |
| 2002/0119403 | A1* | 8/2002 | Yoo | H01L 21/76829 430/329 |

* cited by examiner

*Primary Examiner* — Sonya D McCall Shepard
(74) *Attorney, Agent, or Firm* — Winston Hsu; Scott Margo

(57) ABSTRACT

An etching method includes forming a high density structure and a low density structure on a substrate. A first material layer is formed to cover both structures. Part of the low density structure is exposed through the first material layer. A second material layer is formed to cover the first material layer. The second material layer is etched to remove the second material layer on the high density structure and part of the second material layer on the low density structure. The first material layer on the high density structure and the second material layer on the low density structure are simultaneously etched. The first material layer is etched to expose a first portion of the high density structure and a second portion of the low density structure. Finally, the first portion and the second portion are removed.

10 Claims, 4 Drawing Sheets

ETCHING METHOD FOR REDUCING MICROLOADING EFFECT

BACKGROUND OF THE INVENTION

1. Field of the Invention

The present invention relates to an etching method and particularly to an etching method which can reduce a microloading effect.

2. Description of the Prior Art

Electronic devices, such as integrated circuits, are formed by deposition, growth and etching of material on a substrate. In a typical etching process, a patterned mask is formed on the substrate by a conventional photolithographic process, and then exposed portions of the substrate are etched away. In the etching process, it is desirable to control the dimensions of the features being etched. Conventional etching processes, however, often result in non-uniform etching rates and microloading effects across the substrate.

The mask layer such as a photoresist is formed by a spin coating process on the substrate or a material layer which is going to be etched. The thickness of the mask layer is influenced by the density of the material layer underneath the mask layer. The spin coating process spreads the mask layer uniformly. Therefore, the mask layer distributes the same volume within a high density region of the material layer and a low density region of the material layer. Because the high density region has a greater density of the material layer, the mask layer is heightened. As a result, the top surface of the mask layer within the high density region is higher than the top surface of the mask layer within the low density region. Different heights of the top surfaces of the mask layer will cause differences in thickness of the material layer within the high density region and the low density region after an etching process.

SUMMARY OF THE INVENTION

Therefore, the present invention provides an etching method to solve the above-mentioned problem.

According to a preferred embodiment of the present invention, an etching method includes providing a substrate having a high density structure and a low density structure thereon. Then, a first material layer is formed to cover and contact the high density structure and the low density structure, wherein part of the low density structure is exposed through the first material layer. A second material layer is formed to cover the high density structure and the low density structure and contact the low density structure exposing through the first material layer. After that, the second material layer is etched to remove the second material layer on the high density structure and to remove part of the second material layer on the low density structure. Subsequently, the first material layer on the high density structure and the second material layer on the low density structure are etched simultaneously. Then, the first material layer on the high density structure and on the low density structure are etched so as to expose a first portion of the high density structure and a second portion of the low density structure. Finally, the first portion and the second portion are removed.

According to a preferred embodiment of the present invention, an etching rate of the first material layer is greater than an etching rate of the second material layer.

According to a preferred embodiment of the present invention, the first material layer and the second material layer are made of an identical material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
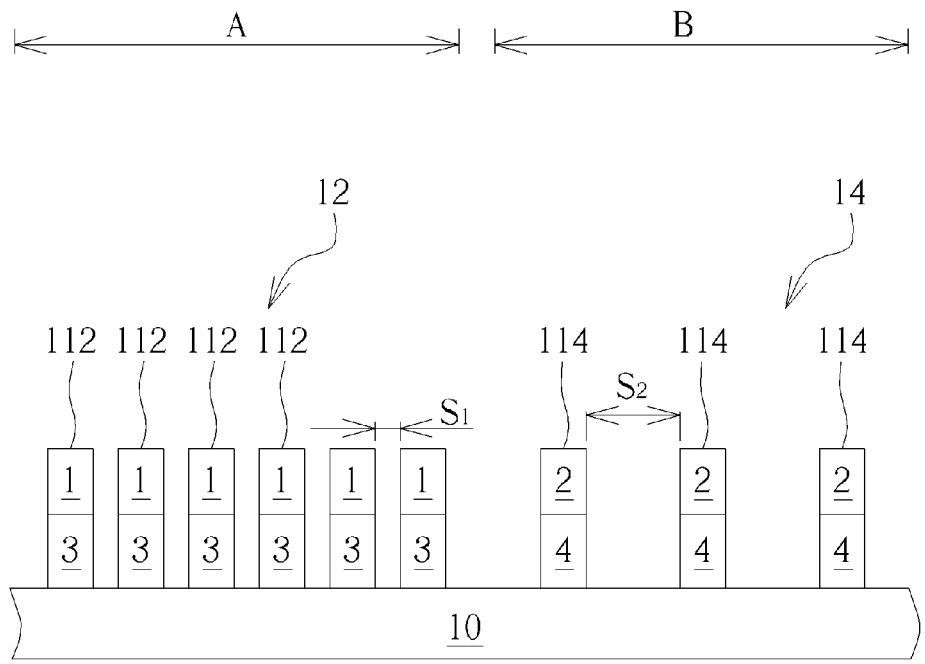
FIGS. 1 to 8 depict an etching method according to a preferred embodiment of the present invention.

FIGS. 1 to 8 depict an etching method according to a preferred embodiment of the present invention. The etching step and the etching back step used in the present invention can be dry etching, wet etching or a combination of both. As shown in FIG. 1, a substrate 10 is provided. The substrate 10 can be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The substrate 10 is defined into a high density region A and a low density region B. A high density structure 12 is disposed on the substrate 10 and within the high density region A. The high density structure 12 includes numerous first structures 112. A first space $S_1$ is between adjacent first structures 112. A low density structure 14 is disposed on the substrate 10 and within the low density region B. The low density structure 14 includes numerous second structures 114. A second space $S_2$ is between adjacent second structures 114. The density of the high density structure 12 is greater than the density of the low density structure 14. Furthermore, the second space $S_2$ is greater than the first space $S_1$. The density of the high density structure 12 refers to the total area occupied by the first structure 112 within the high density region A divided by the area of the high density region A. The density of the low density structure 14 refers to the total area occupied by the second structure 114 within the low density region B divided by the area of the low density region B. Each first structure 112 is divided into a first portion 1 and a third portion 3. Each second structure 114 is divided into a second portion 2 and a fourth portion 4. The first portion 1 is disposed on the third portion 3. The second portion 2 is disposed on the fourth portion 4. According to a preferred embodiment of the present invention, the first portion 1 and the third portion 3 are made of different materials, the second portion 2 and the fourth portion 4 are made of different materials, the first portion 1 and the second portion 2 are made of the same material, and the third portion 3 and the fourth portion 4 are made of the same material. For example, the first portion 1 and the second portion 2 may be a mask layer. The third portion 3 and the fourth portion 4 may be a semiconductive layer. The semiconductive layer can be a gate electrode, fin structure, a dummy gate electrode or other semiconductive elements. The high density structure 12 and the low density structure 14 can be formed by using the same fabricating step. For example, a semiconductive layer (not shown) is formed. Later, a mask (not shown) is formed to cover the substrate 10. Then, patterns of the high density structure 12 and the low density structure 14 are defined above the mask by a lithographic process. The mask and the semiconductive layer are then etched to form the high density structure 12 and the low density structure 14. According to another preferred embodiment, the first portion 1 and the third portion 3 can be made of the same material such as a semiconductive layer. The second portion 2 and the third portion 3 can also be made of the same material such as a semiconductive layer.

Figure 2:
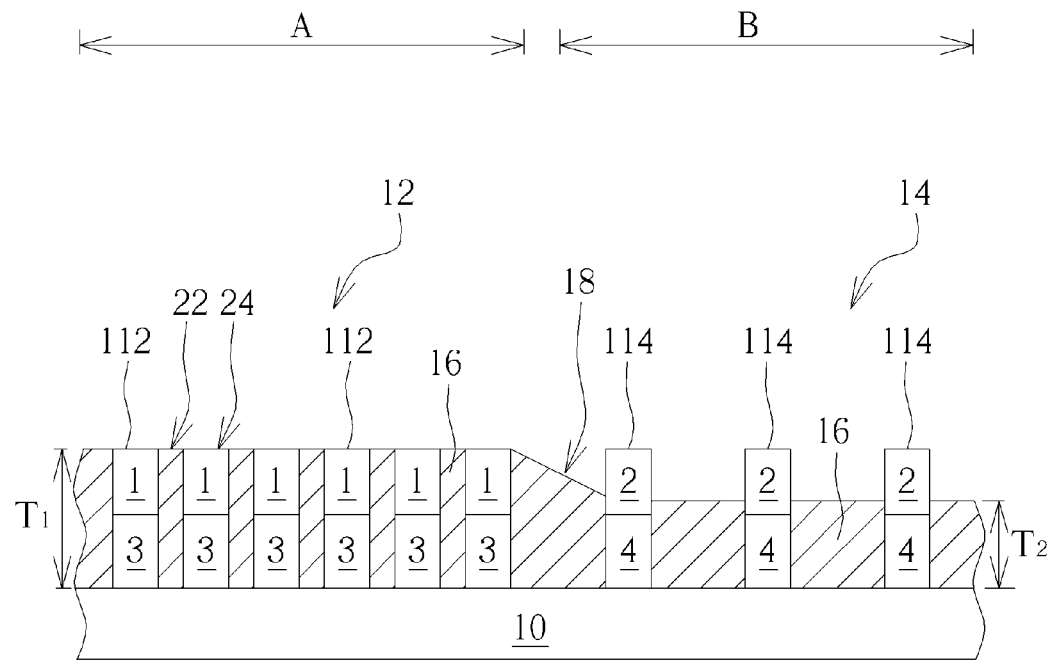

As shown in FIG. 2, a first material layer 16 is formed to cover and contact the high density structure 12 and the low density structure 14. It is noted that part of the low density structure 14 is exposed through the first material layer 16. The high density structure 12, in contrast, is entirely embedded within the first material layer 16. In detail, at least part of the second portion 2 of the low density structure 14 is exposed through the first material layer 16. The first material layer 16 has a slope 18 which descends toward the substrate 10 when moving from the high density region A to the low density region B. In addition, the first material layer 16 within the high density region A and covering the high density structure 12 has a first thickness $T_1$, and the first material layer 16 within the low density region B and covering the low density structure 14 has a second thickness $T_2$, wherein the first thickness $T_1$ is greater than the second thickness $T_2$. Moreover, the first material layer 16 has a first top surface 22. The first portion 1 of each of the first structures 112 has a second top surface 24. The first structures 112 consists the high density structure 12. The first top surface 22 is aligned to the second top surface 24. In other embodiments, the first top surface 22 can be higher than the second top surface 24. The first material layer 16 may include photoresists, deep ultraviolet light absorbing oxide (DUO), spin-on-glass (SOG), bottom anti-reflective coating layer (BRAC layer), sacrificial light absorbing material (SLAM), or silicon oxide.

Figure 3:
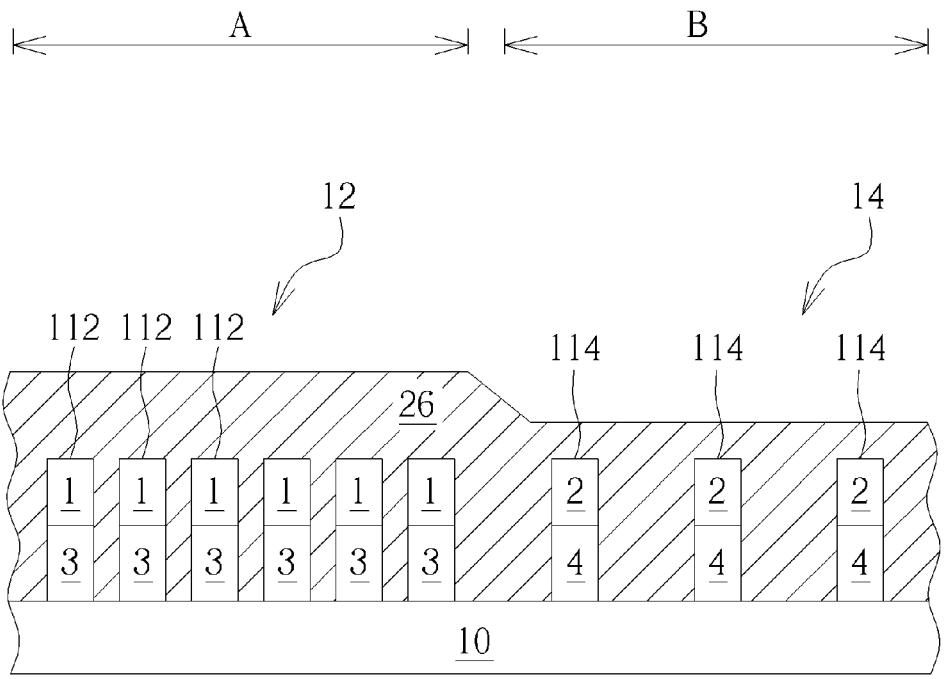
Figure 4:
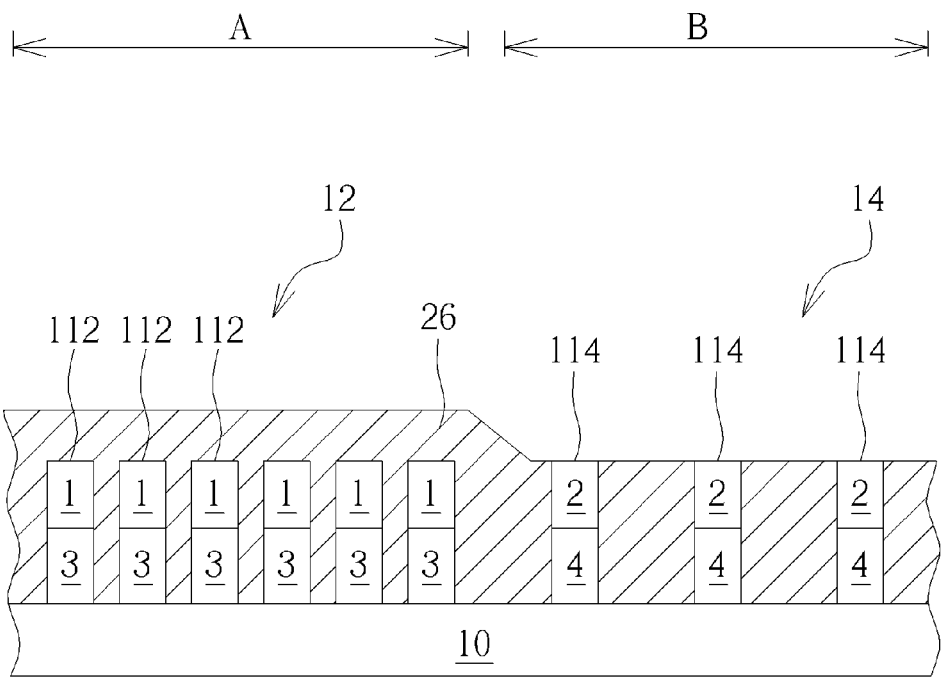

The method of the first material layer 16 may be formed by the following process. As shown in FIG. 3, a first material layer 26 is formed to cover the substrate 10, the high density structure 12 and the low density structure 14. The material layer 26 can be formed on the substrate 10 by a spin coating process or a deposition process. Because the density of the high density structure 12 is higher than the density of the low density structure 14, the thickness of the material layer 26 within the high density region A is thicker than that of the material layer 26 within the low density region B after the spin coating process or the deposition process. At this point, both the high density structure 12 and the low density structure 14 are not exposed through the material layer 26. As shown in FIG. 4, the material layer 26 is etched back by taking the low density structure 14 as an etching stop layer until the low density structure 14 is exposed. Then, the material layer 26 is over etched to expose more of the low density structure 14, while the first portion 1 of the high density structure 12 remains embedded within the material layer 26. At this point, the material layer 26 becomes the first material layer 16 in FIG. 2.

Figure 5:
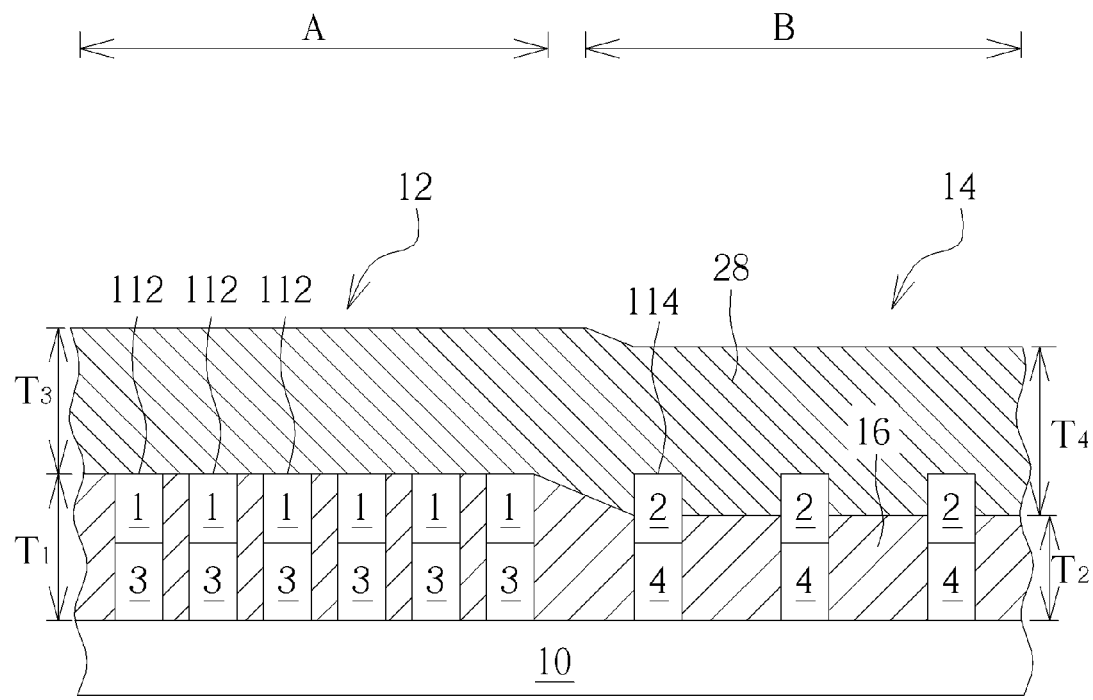

As shown in FIG. 5, a second material layer 28 is formed to cover the high density structure 12 and the low density structure 14. The second material layer 28 contacts the low density structure 14 exposed through the first material layer 16. The second material layer 28 is generally formed on the first material layer 16 by a spin coating process or a deposition process. Since part of the low density structure 14 is exposed through the first material layer 16, there is a teeth-like profile within the low density region B. The second surface 24 of the high density structure 12 is aligned or higher than the first surface 22 of the first material layer 26, so there is a planar profile within the high density region A. As a result, when the second material layer 28 is formed on the first material layer 16 by the spin coating process or the deposition process, the second material layer 28 will be thicker within the low density region B than within the high density region A. That is, the second material layer 28 covering the high density structure 12 has a third thickness $T_3$, and the second material layer 28 covering the low density structure 14 has a fourth thickness $T_4$, wherein the fourth thickness $T_4$ is greater than the third thickness $T_3$. In addition, the second material layer 28 includes may include photoresists, deep ultra violet light absorbing oxide (DUO), spin-on-glass (SOG), bottom anti-reflective coating layer (BRAC layer), sacrificial light absorbing material (SLAM), or silicon oxide. In this embodiment, the first material 16 and the second material 28 are preferably made of different materials. Moreover, under the same etching condition, the etching rate of the first material layer 16 is higher than the etching rate of the second material layer 28. For example, the first material layer 16 may be a photoresist with a high etching rate, and the second material layer 28 may be a photoresist with a high etching rate.

Figure 6:
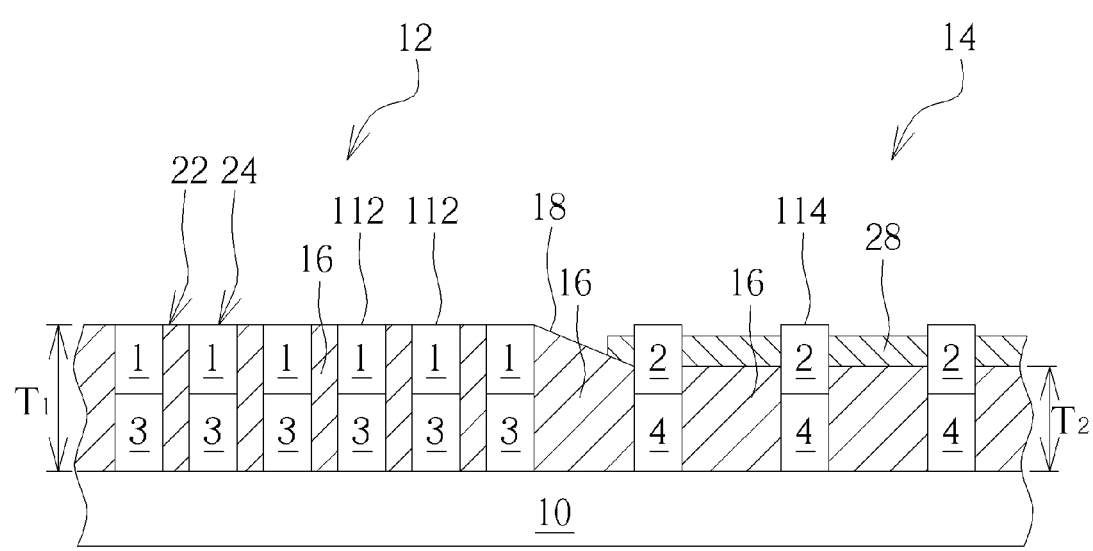

As shown in FIG. 6, the second material layer 28 within the high density region A and within the low density region B is etched simultaneously to remove the entire second material layer 28 on the high density structure 12 and remove part of the second material layer 28 on the low density structure 14. Because the third thickness $T_3$ is smaller than the fourth thickness $T_4$, all of the second material layer 28 on the high density structure 12 will be used up earlier than the second material layer 28 on the low density structure 14. Therefore, when the second material layer 28 on the high density structure 12 is removed (used up) completely and the first material layer 16 on the high density structure 12 is exposed, some of the second material layer 28 still remains on the low density structure 14.

Figure 7:
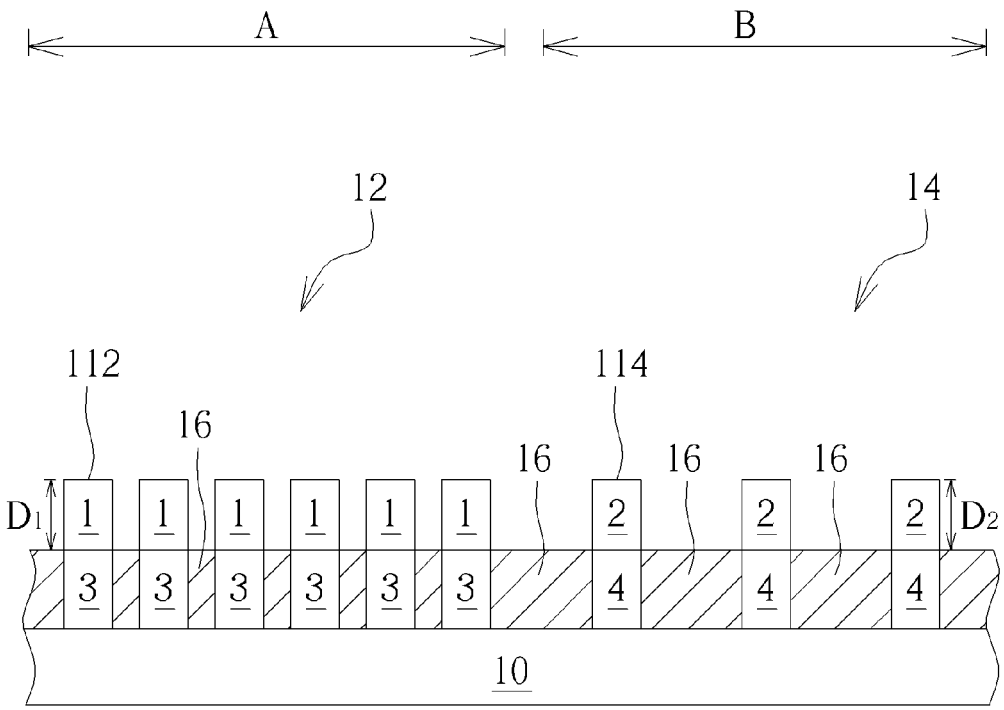
Figure 8:
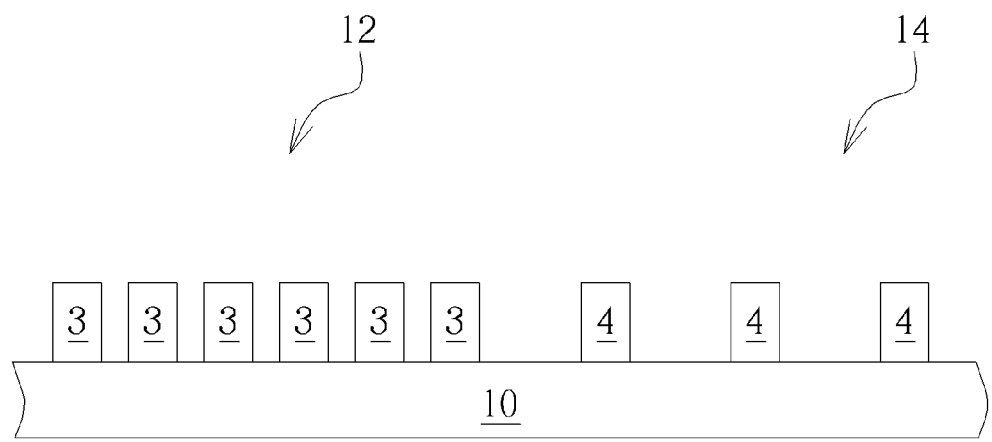

Please refer to FIG. 6 and FIG. 7. The first material layer 16 on the high density structure 12 and the second material layer 28 on the low density structure 14 are etched simultaneously. After the second material layer 28 on the low density structure 14 is completely removed, the first material layer 16 on the low density structure 14 is etched during etching of the first material layer 16 on the high density structure 12. The etching process will stop when a first predetermined height $D_1$ on the first portion 1 of the high density structure 12 is exposed, and a second predetermined height $D_2$ on the second portion 2 of the low density structure 14 is exposed. At this point, the second material layer 28 on the substrate 10 is entirely removed. As shown in FIG. 8, the exposed first portion 1 and the exposed second portion 2 are removed. The first predetermined height $D_1$ and the second predetermined height $D_2$ are usually the same size. According to a preferred embodiment of the present invention, the first predetermined height $D_1$ equals the thickness of the first portion 1, and the second predetermined height $D_2$ equals the thickness of the second portion 2, i.e. the first portion 1 and the second portion 2 are removed completely in the steps illustrated in FIG. 8. The first portion 1 and the second portion 2 are preferably removed by an etching process. According to another preferred embodiment, the first predetermined height $D_1$ can be smaller than the thickness of the first portion 1, and the second predetermined height $D_2$ can be smaller than the thickness of the second portion 2. Therefore, only part of the first portion 1 and part of the second portion 2 are removed. In addition, the first predetermined height $D_1$ may equal or not equal the second predetermined height $D_2$. According to different requirements, the first material layer 16 can be etched after the first predetermined height $D_1$ and the second predetermined height $D_2$ are exposed to expose predetermined heights (not shown) of the third portion 3 and the fourth portion 4. After that, the first portion 1, the second portion 2, the exposed third portion 3 and the exposed fourth portion 4 are removed.

After the first portion 1 and the second portion 2 are removed, the first material layer 16 can optionally be entirely removed. If the third portion 3 and the fourth portion 4 serve as dummy gates, and the first material layer 16 is a dielectric layer, the first material layer 16 will be kept. If the third portion 3 and the fourth portion 4 serve as normal gates, the first material layer 16 will be removed. FIG. 8 is an example of the first material layer 16 being removed completely. Based on different product's design, the first portion 1, the second portion 2, the third portion 3, the fourth portion 4, the material layer 16 and the substrate 10 can use different combinations of possible materials. Whether the third portion 3, the fourth portion 4 and the first material layer 16 are removed or not can be decided by the combinations of possible materials.

According to another preferred embodiment of the present invention, the first material layer 16 and the second material layer 28 can be made of the same material. Other fabricating processes are substantially the same as the previous embodiment, and a detailed description is therefore omitted herein.

A material layer formed by a spin coating process usually has a greater thickness in the high density region and smaller thickness in the low density region because of the physical property of the spin coating process. The thickness differences in the high density region and the low density region causes the microloading effect. Therefore, the present invention utilizes two material layers to cover the low density region and the high density region. Using the etching ratios between the two material layers to compensate for the thickness difference causing by the spin coating process can make structures in the high density region and the low density region be etched to substantially the same thickness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An etching method comprising:
providing a substrate having a high density structure and a low density structure thereon;
forming a first material layer covering and contacting the high density structure and the low density structure, wherein part of the low density structure is exposed through the first material layer;
forming a second material layer covering the high density structure and the low density structure and contacting the low density structure exposed through the first material layer;
etching the second material layer to remove the second material layer on the high density structure and to remove part of the second material layer on the low density structure;
etching the first material layer on the high density structure and the second material layer on the low density structure simultaneously;
etching the first material layer on the high density structure and on the low density structure to expose a first portion of the high density structure and a second portion of the low density structure; and
removing the first portion and the second portion.

2. The etching method of claim 1, wherein an etching ratio of the first material layer is greater than an etching ratio of the second material layer.

3. The etching method of claim 1, wherein the first material layer comprises a first top surface, the high density structure comprises a second top surface, and during forming the first material layer covering and contacting the high density structure and the low density structure, the first top surface is aligned with the second top surface.

4. The etching method of claim 1, wherein the first material layer comprises photoresist, deep ultra violet light absorbing oxide, spin-on-glass, bottom anti-reflective coating layer or sacrificial light absorbing material.

5. The etching method of claim 1, wherein the second material layer comprises photoresist, deep ultra violet light absorbing oxide, spin-on-glass, bottom anti-reflective coating layer or sacrificial light absorbing material.

6. The etching method of claim 1, wherein during forming the first material layer covering and contacting the high density structure and the low density structure, the first material layer covering the high density structure comprises a first thickness, the first material layer covering the low density structure comprises a second thickness and the first thickness is greater than the second thickness.

7. The etching method of claim 1, wherein during forming the second material layer covering the high density structure and the low density structure, the second material layer covering the high density structure comprises a third thickness, the second material layer covering the low density structure comprises a fourth thickness and the fourth thickness is greater than the third thickness.

8. The etching method of claim 1, wherein the high density structure comprises a plurality of first structures, the low density structure comprises a plurality of second structures, a first space is disposed between adjacent first structures, a second space is disposed between adjacent second structures, and the second space is greater than the first space.

9. The etching method of claim 1, wherein the first portion and the second portion are made of the same material.

10. The etching method of claim 1, wherein the first material layer and the second material layer are made of the same material.

* * * * *